United States Patent
Loo et al.

(10) Patent No.: US 11,355,427 B2
(45) Date of Patent: Jun. 7, 2022

(54) DEVICE, METHOD AND SYSTEM FOR PROVIDING RECESSED INTERCONNECT STRUCTURES OF A SUBSTRATE

(71) Applicant: Intel Corporation, Santa Clara, CA (US)

(72) Inventors: Howe Yin Loo, Sungai Petani (MY); Sujit Sharan, Chandler, AZ (US); Tin Poay Chuah, Bayan Lepas (MY); Ananth Prabhakumar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/095,916

(22) PCT Filed: Jul. 1, 2016

(86) PCT No.: PCT/US2016/040832
§ 371 (c)(1),
(2) Date: Oct. 23, 2018

(87) PCT Pub. No.: WO2018/004686
PCT Pub. Date: Jan. 4, 2018

(65) Prior Publication Data
US 2019/0131227 A1 May 2, 2019

(51) Int. Cl.
*H01L 23/498* (2006.01)
*H01L 23/13* (2006.01)
(Continued)

(52) U.S. Cl.
CPC ...... *H01L 23/49827* (2013.01); *H01L 21/486* (2013.01); *H01L 21/76898* (2013.01);
(Continued)

(58) Field of Classification Search
CPC .............. H01L 23/13; H05K 1/183; H05K 2201/09036; H05K 2201/09072; H05K 3/4697
See application file for complete search history.

(56) References Cited

U.S. PATENT DOCUMENTS

| 4,985,107 A | * | 1/1991 | Conroy | ............. H05K 13/0413 |
| | | | | 156/299 |
| 5,094,969 A | * | 3/1992 | Warren | .................. H01L 23/13 |
| | | | | 257/701 |

(Continued)

FOREIGN PATENT DOCUMENTS

| KR | 10-0870652 | 11/2008 | | |
| KR | 100870652 B1 | * 11/2008 | ............. | H01L 23/48 |

(Continued)

OTHER PUBLICATIONS

Machine translation, Otsubo, WIPO Pat. Pub. No. JPWO2014125973A1, translation date: Nov. 13, 2021, Espacenet, all pages. (Year: 2021).*

(Continued)

*Primary Examiner* — Victoria K. Hall
(74) *Attorney, Agent, or Firm* — Schwabe, Williamson & Wyatt, P.C.

(57) ABSTRACT

Techniques and mechanisms to facilitate connectivity between circuit components via a substrate. In an embodiment, a microelectronic device includes a substrate, wherein a recess region extends from the first side of the substrate and only partially toward a second side of the substrate. First input/output (IO) contacts of a first hardware interface are disposed in the recess region. The first IO contacts are variously coupled to each to a respective metallization layer of the substrate, wherein the recess region extends though one or more other metallization layers of the substrate. In another embodiment, the microelectronic device further (Continued)

comprises second IO contacts of a second hardware interface, the second IO contacts to couple the microelectronic device to a printed circuit board.

19 Claims, 9 Drawing Sheets

(51) Int. Cl.
- H01L 23/14 (2006.01)
- H01L 23/31 (2006.01)
- H01L 21/48 (2006.01)
- H01L 21/768 (2006.01)
- H05K 1/18 (2006.01)
- H01L 25/065 (2006.01)

(52) U.S. Cl.
CPC ............ *H01L 23/13* (2013.01); *H01L 23/147* (2013.01); *H01L 23/3114* (2013.01); *H01L 25/0655* (2013.01); *H05K 1/181* (2013.01); *H05K 1/183* (2013.01); *H01L 2224/16225* (2013.01)

(56) References Cited

U.S. PATENT DOCUMENTS

| | | | | |
|---|---|---|---|---|
| 5,796,165 | A * | 8/1998 | Yoshikawa | H01L 23/053 257/728 |
| 6,441,498 | B1 * | 8/2002 | Song | H01L 23/13 257/778 |
| 6,445,591 | B1 * | 9/2002 | Kwong | H01L 25/105 361/764 |
| 6,459,593 | B1 * | 10/2002 | Kwong | H01L 25/0652 174/255 |
| 6,535,388 | B1 * | 3/2003 | Garcia | H01L 23/24 165/80.3 |
| 6,792,179 | B2 * | 9/2004 | Lu | G02B 6/43 385/31 |
| 6,952,049 | B1 * | 10/2005 | Ogawa | H01L 23/13 257/700 |
| 6,975,025 | B2 * | 12/2005 | LeBonheur | H01L 25/16 257/700 |
| 7,928,552 | B1 * | 4/2011 | Cho | H01L 21/565 257/686 |
| 8,072,764 | B2 * | 12/2011 | Yeates | H05K 1/117 361/748 |
| 8,217,272 | B2 * | 7/2012 | Choudhury | H01L 23/3677 174/255 |
| 8,218,337 | B2 * | 7/2012 | Choudhury | H05K 1/0236 361/818 |
| 8,264,846 | B2 * | 9/2012 | Jones | H01L 25/165 361/760 |
| 8,513,792 | B2 * | 8/2013 | Ganesan | H01L 21/50 257/686 |
| 8,872,349 | B2 * | 10/2014 | Chiu | H01L 23/5381 257/774 |
| 8,890,628 | B2 * | 11/2014 | Nair | H01L 25/16 257/416 |
| 8,981,555 | B2 * | 3/2015 | Lee | H01L 23/42 165/185 |
| 8,987,896 | B2 * | 3/2015 | Cheah | H05K 1/185 257/724 |
| 9,515,052 | B1 * | 12/2016 | Lee | H01L 23/49816 |
| 9,837,343 | B2 * | 12/2017 | Kim | H01L 23/49827 |
| 10,004,140 | B2 * | 6/2018 | Kobayashi | H05K 1/183 |
| 10,165,669 | B2 * | 12/2018 | Kawagoe | H01L 25/167 |
| 2002/0145180 | A1 * | 10/2002 | Terui | H01L 23/3128 257/666 |
| 2002/0155642 | A1 * | 10/2002 | Noquil | H01L 21/4853 438/125 |
| 2002/0185717 | A1 * | 12/2002 | Eghan | H01L 23/055 257/678 |
| 2003/0038376 | A1 * | 2/2003 | Bolken | H01L 21/563 257/778 |
| 2003/0153108 | A1 * | 8/2003 | Durocher | H01L 23/13 438/26 |
| 2003/0165052 | A1 * | 9/2003 | Negishi | H01L 25/165 361/783 |
| 2003/0228511 | A1 * | 12/2003 | Xie | H01M 8/0271 429/514 |
| 2004/0016996 | A1 * | 1/2004 | Tang | H01L 21/481 257/678 |
| 2004/0017670 | A1 * | 1/2004 | Bando | H01L 23/13 361/761 |
| 2004/0022038 | A1 * | 2/2004 | Figueroa | H01L 23/642 361/763 |
| 2004/0106229 | A1 * | 6/2004 | Jiang | H01L 23/3128 438/106 |
| 2004/0155337 | A1 * | 8/2004 | Strandberg | H01L 23/13 257/738 |
| 2004/0245655 | A1 * | 12/2004 | Ida | H01L 23/13 257/784 |
| 2005/0241128 | A1 * | 11/2005 | Berry | H05K 3/4697 29/25.42 |
| 2006/0120058 | A1 * | 6/2006 | Fairchild | H01L 23/13 361/761 |
| 2006/0145339 | A1 * | 7/2006 | Yang | H01L 23/13 257/724 |
| 2006/0216955 | A1 * | 9/2006 | Swenson | H01C 17/006 438/800 |
| 2007/0289127 | A1 * | 12/2007 | Hurwitz | H01L 21/4857 29/827 |
| 2008/0029852 | A1 * | 2/2008 | Murayama | B81C 1/0023 257/621 |
| 2008/0102410 | A1 * | 5/2008 | Kim | H01L 21/4857 430/312 |
| 2008/0116566 | A1 * | 5/2008 | Murayama | B81C 1/00301 257/700 |
| 2008/0117607 | A1 * | 5/2008 | Murayama | H01L 21/4846 361/760 |
| 2008/0128882 | A1 * | 6/2008 | Baek | H01L 21/568 257/686 |
| 2008/0142961 | A1 * | 6/2008 | Jones | H01L 25/165 257/724 |
| 2008/0230892 | A1 * | 9/2008 | Chang | H01L 25/0657 257/700 |
| 2009/0107708 | A1 * | 4/2009 | Takahashi | H05K 1/183 174/257 |
| 2009/0212416 | A1 * | 8/2009 | Skeete | H01L 23/13 257/698 |
| 2009/0279268 | A1 * | 11/2009 | Son | H01L 23/13 361/729 |
| 2009/0321527 | A1 * | 12/2009 | Kato | G06K 19/07749 235/486 |
| 2010/0044853 | A1 * | 2/2010 | Dekker | B81C 1/00087 257/692 |
| 2010/0073894 | A1 * | 3/2010 | Mortensen | C25D 1/00 361/782 |
| 2010/0147560 | A1 * | 6/2010 | Kaneko | H01L 23/13 174/250 |
| 2010/0170700 | A1 * | 7/2010 | Nakamura | H05K 1/183 174/254 |
| 2010/0207218 | A1 * | 8/2010 | Taguchi | B81B 7/007 257/415 |
| 2010/0213599 | A1 * | 8/2010 | Watanabe | H01L 23/5389 257/693 |
| 2010/0230148 | A1 * | 9/2010 | Kariya | H01L 23/49816 174/258 |
| 2010/0244161 | A1 * | 9/2010 | Tabrizi | B81B 7/0064 257/415 |
| 2010/0244276 | A1 * | 9/2010 | Burleson | H01L 24/17 257/777 |
| 2010/0291737 | A1 * | 11/2010 | Ikeguchi | H05K 1/144 438/108 |
| 2010/0327424 | A1 * | 12/2010 | Braunisch | H01L 25/0652 257/692 |
| 2010/0330747 | A1 * | 12/2010 | Shin | H05K 1/183 438/125 |

(56) References Cited

U.S. PATENT DOCUMENTS

| | | | |
|---|---|---|---|
| 2011/0089553 A1* | 4/2011 | Kim | H01L 23/13 257/686 |
| 2011/0186998 A1* | 8/2011 | Wu | H01L 23/49833 257/738 |
| 2011/0254160 A1* | 10/2011 | Tsai | H01L 21/486 257/738 |
| 2012/0020026 A1* | 1/2012 | Oganesian | H01L 23/5389 361/707 |
| 2012/0104623 A1* | 5/2012 | Pagaila | H01L 23/13 257/774 |
| 2012/0139010 A1* | 6/2012 | Takeda | H01L 23/13 257/213 |
| 2012/0146177 A1* | 6/2012 | Choi | H01L 25/16 257/528 |
| 2012/0153432 A1* | 6/2012 | Karakane | H01L 23/13 257/528 |
| 2012/0228754 A1* | 9/2012 | Liu | H01L 23/13 257/676 |
| 2013/0001797 A1* | 1/2013 | Choi | H01L 25/105 257/774 |
| 2013/0001798 A1* | 1/2013 | Choi | H01L 23/49827 257/774 |
| 2013/0032390 A1* | 2/2013 | Hu | H01L 23/147 174/266 |
| 2013/0056862 A1* | 3/2013 | Kim | H01L 25/0657 257/692 |
| 2013/0069218 A1* | 3/2013 | Seah | H01L 23/13 257/712 |
| 2013/0082386 A1* | 4/2013 | Meyer-Berg | H01L 23/12 257/762 |
| 2013/0099368 A1* | 4/2013 | Han | H01L 23/13 257/692 |
| 2013/0161836 A1* | 6/2013 | Yeom | H01L 25/105 257/778 |
| 2013/0265727 A1* | 10/2013 | Segawa | H05K 1/183 361/748 |
| 2013/0277865 A1* | 10/2013 | Teh | H01L 23/498 257/782 |
| 2014/0002979 A1* | 1/2014 | Leigh | H05K 7/10 361/679.31 |
| 2014/0042610 A1* | 2/2014 | Li | H01L 24/19 257/712 |
| 2014/0054080 A1* | 2/2014 | Sato | H05K 1/183 174/266 |
| 2014/0091428 A1* | 4/2014 | Hossain | H01L 23/5389 257/532 |
| 2014/0138130 A1* | 5/2014 | Chang | H05K 3/4697 174/257 |
| 2014/0144675 A1* | 5/2014 | Hsu | H05K 3/4694 174/251 |
| 2014/0210065 A1* | 7/2014 | Nishimura | H01L 23/13 257/676 |
| 2014/0218883 A1* | 8/2014 | Dakhiya | H05K 3/36 361/761 |
| 2014/0246227 A1* | 9/2014 | Lin | H01L 21/4857 174/266 |
| 2014/0247570 A1* | 9/2014 | Wang | H05K 1/186 29/837 |
| 2014/0251669 A1* | 9/2014 | Manusharow | H01L 23/13 174/260 |
| 2014/0328038 A1* | 11/2014 | Kato | H01L 21/4857 361/761 |
| 2014/0334120 A1* | 11/2014 | Dakhiya | H01L 23/5384 361/761 |
| 2015/0049498 A1* | 2/2015 | Zhou | H01L 21/4846 362/382 |
| 2015/0061142 A1* | 3/2015 | Hsu | H01L 25/105 257/773 |
| 2015/0061152 A1* | 3/2015 | Chen | H01L 25/0657 257/774 |
| 2015/0091179 A1* | 4/2015 | Shenoy | H01L 23/5381 257/774 |
| 2015/0102484 A1* | 4/2015 | Chen | H01L 23/3121 257/737 |
| 2015/0131248 A1* | 5/2015 | Dakhiya | H05K 3/4697 361/761 |
| 2015/0156881 A1* | 6/2015 | Shimizu | H01L 23/13 174/255 |
| 2015/0206812 A1* | 7/2015 | Kim | H01L 23/053 257/622 |
| 2015/0206848 A1* | 7/2015 | Boja | H01L 23/5385 257/774 |
| 2015/0214206 A1* | 7/2015 | Kumar | H01L 25/18 257/777 |
| 2015/0235915 A1* | 8/2015 | Liang | H01L 21/4857 361/764 |
| 2015/0235936 A1* | 8/2015 | Yu | H01L 23/49816 257/738 |
| 2015/0235989 A1* | 8/2015 | Yu | H01L 25/50 257/712 |
| 2015/0235990 A1* | 8/2015 | Cheng | H01L 25/105 257/712 |
| 2015/0279813 A1* | 10/2015 | Chase | H01L 23/5389 257/777 |
| 2015/0325529 A1* | 11/2015 | Choi | H01L 23/13 257/723 |
| 2016/0007449 A1* | 1/2016 | Kim | H01L 23/49827 361/761 |
| 2016/0013123 A1* | 1/2016 | Pai | H01L 25/50 257/774 |
| 2016/0037640 A1* | 2/2016 | Takai | H01L 23/293 361/753 |
| 2016/0081182 A1* | 3/2016 | Kang | H01L 25/105 361/803 |
| 2016/0090298 A1* | 3/2016 | Sengupta | B81B 7/0048 257/415 |
| 2016/0120033 A1* | 4/2016 | Furusawa | H01L 23/13 174/251 |
| 2016/0183363 A1* | 6/2016 | Lee | B23K 26/362 174/254 |
| 2016/0242292 A1* | 8/2016 | Nishimura | H05K 1/183 |
| 2016/0247781 A1* | 8/2016 | Sung | H01L 23/13 |
| 2016/0293537 A1* | 10/2016 | Sugiyama | H01L 23/13 |
| 2016/0316565 A1* | 10/2016 | Chen | H05K 1/181 |
| 2016/0322294 A1* | 11/2016 | Kobayashi | H01L 23/49822 |
| 2016/0322340 A1* | 11/2016 | Li | H01L 25/18 |
| 2016/0358848 A1* | 12/2016 | Meyer | H01L 21/4853 |
| 2016/0372448 A1* | 12/2016 | Yazdani | H01L 25/105 |
| 2017/0018493 A1* | 1/2017 | Lee | H01L 23/13 |
| 2017/0047308 A1* | 2/2017 | Ho | H01L 23/5386 |
| 2017/0055349 A1* | 2/2017 | Chang | H05K 3/4697 |
| 2017/0148716 A9* | 5/2017 | Chiang | H01L 21/561 |
| 2017/0207196 A1* | 7/2017 | Lee | H01L 23/48 |
| 2017/0223839 A1* | 8/2017 | Jain | H05K 3/288 |
| 2017/0287872 A1* | 10/2017 | Shen | H01L 24/19 |
| 2017/0372980 A1* | 12/2017 | Kurahashi | H05K 3/4602 |
| 2018/0084648 A1* | 3/2018 | Miyawaki | H05K 3/368 |
| 2018/0342431 A1* | 11/2018 | Reingruber | H01L 23/12 |
| 2019/0057915 A1* | 2/2019 | Starkston | H01L 23/488 |
| 2019/0057940 A1* | 2/2019 | Cheah | H01L 21/4857 |
| 2019/0074199 A1* | 3/2019 | Chan Arguedas | H01L 23/13 |
| 2019/0139915 A1* | 5/2019 | Dalmia | H01L 23/42 |
| 2019/0324223 A1* | 10/2019 | Yim | G02B 6/4246 |
| 2019/0333861 A1* | 10/2019 | Pietambaram | H01L 25/03 |
| 2020/0066621 A1* | 2/2020 | Liu | H01L 25/065 |
| 2020/0075501 A1* | 3/2020 | Raorane | H01L 23/49 |

FOREIGN PATENT DOCUMENTS

| | | | |
|---|---|---|---|
| WO | WO-2014125973 A1 * | 8/2014 | H05K 3/46 |
| WO | WO 2016189609 A1 * | 12/2016 | H05K 1/145 |

OTHER PUBLICATIONS

Machine translation, Ikeguchi, Korean Pat. Pub. No. KR-100870652B1, translation date: Mar. 10, 2022, Espacenet, all pages. (Year: 2022).*

(56) References Cited

OTHER PUBLICATIONS

International Search Report and Written Opinion for International Patent Application No. PCT/US2016/040832 dated Apr. 26, 2017, 15 pgs.
International Preliminary Report on Patentability for International Patent Application No. PCT/US2016/040832 dated Jan. 10, 2019, 10 pgs.

* cited by examiner

DEVICE, METHOD AND SYSTEM FOR PROVIDING RECESSED INTERCONNECT STRUCTURES OF A SUBSTRATE

CROSS-REFERENCE TO RELATED APPLICATION

This patent application is a U.S. National Phase Application under 35 U.S.C. § 371 of International Application No. PCT/US2016/040832, filed Jul. 1, 2016, entitled "DEVICE, METHOD AND SYSTEM FOR PROVIDING RECESSED INTERCONNECT STRUCTURES OF A SUBSTRATE," which designates the United States of America, the entire disclosure of which is hereby incorporated by reference in its entirety and for all purposes.

BACKGROUND

1. Technical Field

Embodiments discussed herein relate generally to microelectronic devices and more particularly, but not exclusively, to structures for providing interconnection of circuitry via a substrate.

2. Background Art

Mobile, tablet, and ultrabook technologies require microelectronic devices with increasingly reduced dimensions, also known as a small form factor. Packaged semiconductor devices and other integrated circuit (IC) devices often include a substrate and one or more IC dies, passive circuit elements and/or other circuit components that contribute to horizontal (x-y plane) dimensions and vertical (z-axis) height, limiting the degree to which package form factor can be reduced.

As various technologies approach the lower limits of their respective form factors, there is an increasing demand for solutions that provide for incremental improvements in the efficiency of space taken up by microelectronic devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms to facilitate operation of circuit components while coupled to one another via a substrate. In an embodiment, such a substrate forms a recess structure that extends through one or more metallization layers of the substrate. Such a recess structure may extend only partially through the substrate—e.g., wherein the recess structure extends through some (but not all) of different layers of interconnect structures which are stacked in parallel with each other. For example, structures of an intermediate metallization layer of the substrate may be exposed at—or accessed via—a most recessed (or "bottom") portion of the recess structure.

In an embodiment, the recess structure is configured to receive a unit comprising one or more circuit components which, for example, are each disposed in a single packaged device or in different respective packaged devices. The recess structure may allow the unit to be suspended at least partially under a side of the substrate while the substrate is coupled, directly or indirectly, to a printed circuit board (PCB) or other such hardware. Certain embodiments variously provide for an improved z-height profile of systems including including multiple circuit components coupled to one another via a substrate.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate and circuit components coupled thereto.

Figure 1:
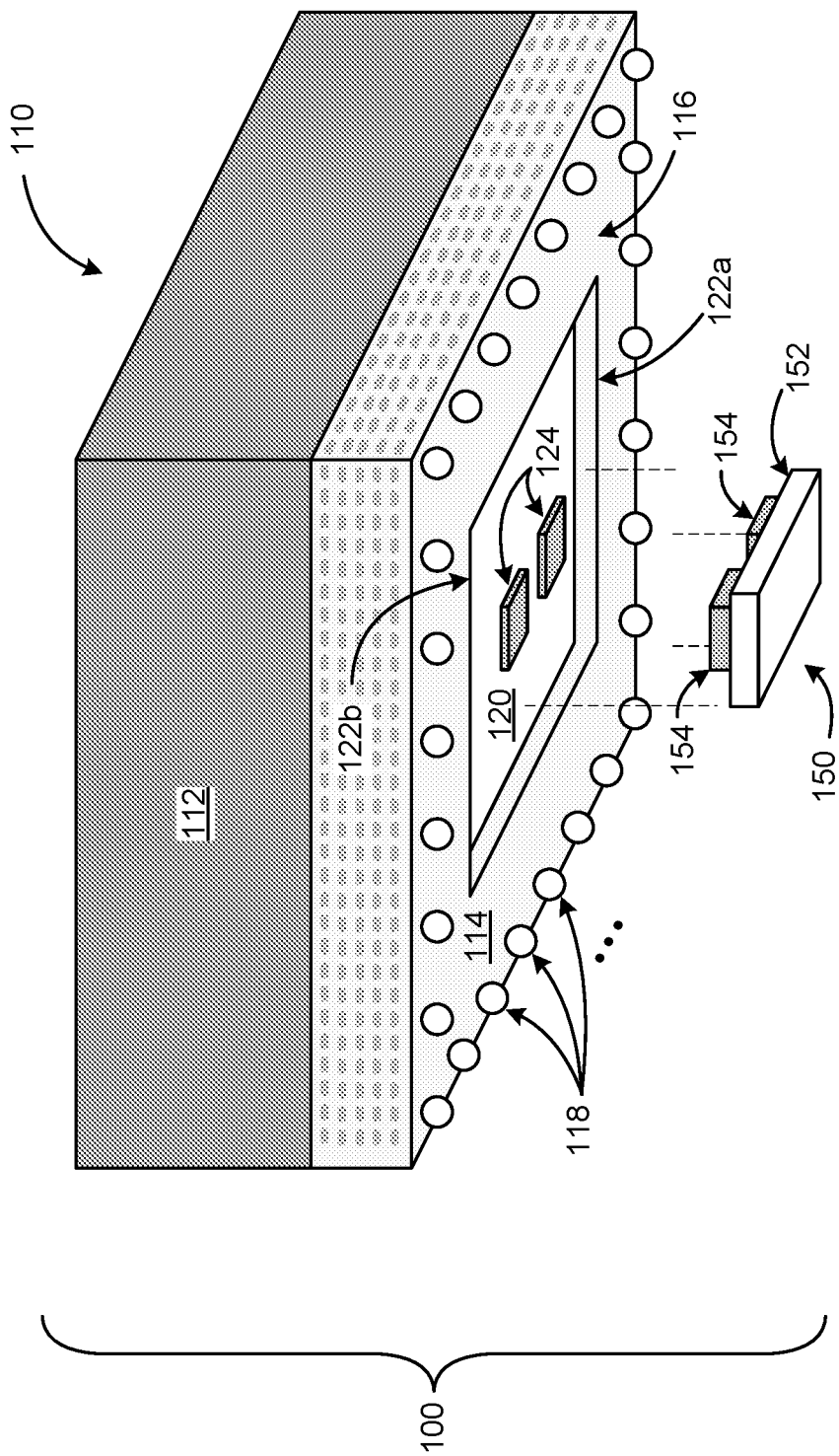
FIG. 1 is an exploded view of a system for providing interconnection of circuitry with a substrate according to an embodiment.

FIG. 1 is an exploded view of a system 100 to provide connectivity between circuit components according to an embodiment. System 100 may include a processing-capable platform or operate as a component of such a platform. For example, system 100 may include any of a variety of packaged devices that are to provide functionality of a processor, a memory subsystem, a system-in-package and/or the like.

In an embodiment, system 100 includes an assembly 110 comprising a package material 112 having disposed therein first one or more circuit components (not shown). Package material 112 may include any of a variety of materials known in the art for packaging integrated circuitry. Examples of such materials include, but are not limited to, an epoxy, polymer, resin, plastic, ceramic, etc.

The first one or more circuit components disposed in package material 112 may include, for example, one or more IC dies comprising a NAND memory die and/or any of a variety of other memory die. Additionally or alternatively, such one or more IC dies may include a processor die, an application specific integrated circuit (ASIC), a system-on-chip and/or any of various other IC die. However, some embodiments are not limited with respect to the particular type and/or number of components disposed in package material 112. In other embodiments, assembly 110 omits any such package material 112 disposed on the first one or more circuit components.

Assembly 110 may further comprise a substrate 114 disposed in or on package material 112, the substrate 114 including structures coupled to enable access to the first one or more circuit components of assembly 110. Substrate 114 may include an interposer or any of a variety of other such structures to enable functionality such as that adapted from conventional package technologies. By way of illustration and not limitation, substrate 114 may have formed therein one or more vias, traces or other structures to allow for communicative coupling between assembly 110 and other hardware that is included in system 100 or is to couple to system 100. Although certain embodiments are not limited in this regard, substrate 114 may provide for a fanout of interconnects having a relatively large pitch at a side 116 of substrate 114, as compared to a corresponding pitch of such interconnects at an opposite side (not shown) of substrate 114.

In the illustrative embodiment shown, side 116 has formed thereon one or more contacts 118 (e.g. one or more conductive pins, pads, balls and/or other such connection hardware) of a first hardware interface that is to enable coupling of assembly 110 to some other device (not shown) such as a printed circuit board (PCB) or a packaged device. The one or more contacts 118 may be coupled to enable delivery of data, control signaling, address signaling, clock signaling, power, a reference potential (e.g., ground) and/or any of a variety of other exchanges. The hardware interface including one or more input/output (IO) contacts 118 may include a ball grid array, for example. The particular number and arrangement of contacts 118 (and/or other hardware interface contacts illustrated herein) is merely illustrative, and may vary according to different embodiments having more, fewer and/or differently arranged contacts.

In an embodiment, assembly 110 further comprises another hardware interface that, for example, is to enable coupling of assembly 110 to a device other than that which may couple to assembly 110 via the interface including one or more contacts 118. This other hardware interface may include one or more contacts that are recessed from a plane which includes side 116. By way of illustration and not limitation, this other hardware interface may comprise one or more input/output (IO) contacts 124 disposed in a recess structure 120 formed in substrate 114. For example, edges 122a, 122b of side 116 may define at least in part opposing sidewalls of recess structure 120, where such sidewalls extend from a plane, which includes 116, and partially toward an opposite side of substrate 114. In the illustrative embodiment shown, recess structure 120 extends through some (but not all) of stacked metal layers variously extending in parallel with one another each between respective dielectric structures of substrate 114.

Recess structure 120 may accommodate insertion of additional hardware—e.g., the illustrative unit 150 of system 100—that includes second one or more circuit components (not shown). For example, such second one or more circuit components of unit 150 may be coupled directly or indirectly to the one or more contacts 124 by contacts 154 at side 152 of unit 150. The second one or more circuit components of unit 150 may include a capacitor, inductor, processor chip, memory chip, ASIC, system-on-chip and/or any of various other types of active components or active components, according to different embodiments. In one embodiment, assembly 110 is a first packaged device and unit 150 is another packaged device. Alternatively, unit 150 may be a component—e.g., including a yet-to-be packaged die, die stack, etc.—that is to be packaged with assembly 110 to form a single packaged device having a package-in-package configuration.

As disclosed herein, recess structure 120 may allow for system 100 to exhibit improved z-height characteristics, as compared to existing packaging technologies. For example, recess structure 120 may allow for at least a part of unit 150 to be positioned "below" side 116—e.g., in a region between side 116 and another device (not shown) that is to couple to assembly 110 via one or more contacts 118. In enabling circuitry and/or other structure to be so positioned below side 116, various embodiments allow for package material 112 and/or circuitry disposed in package material 112 to have a lower z-height design, as compared to designs allowed according to existing techniques.

Figure 2:
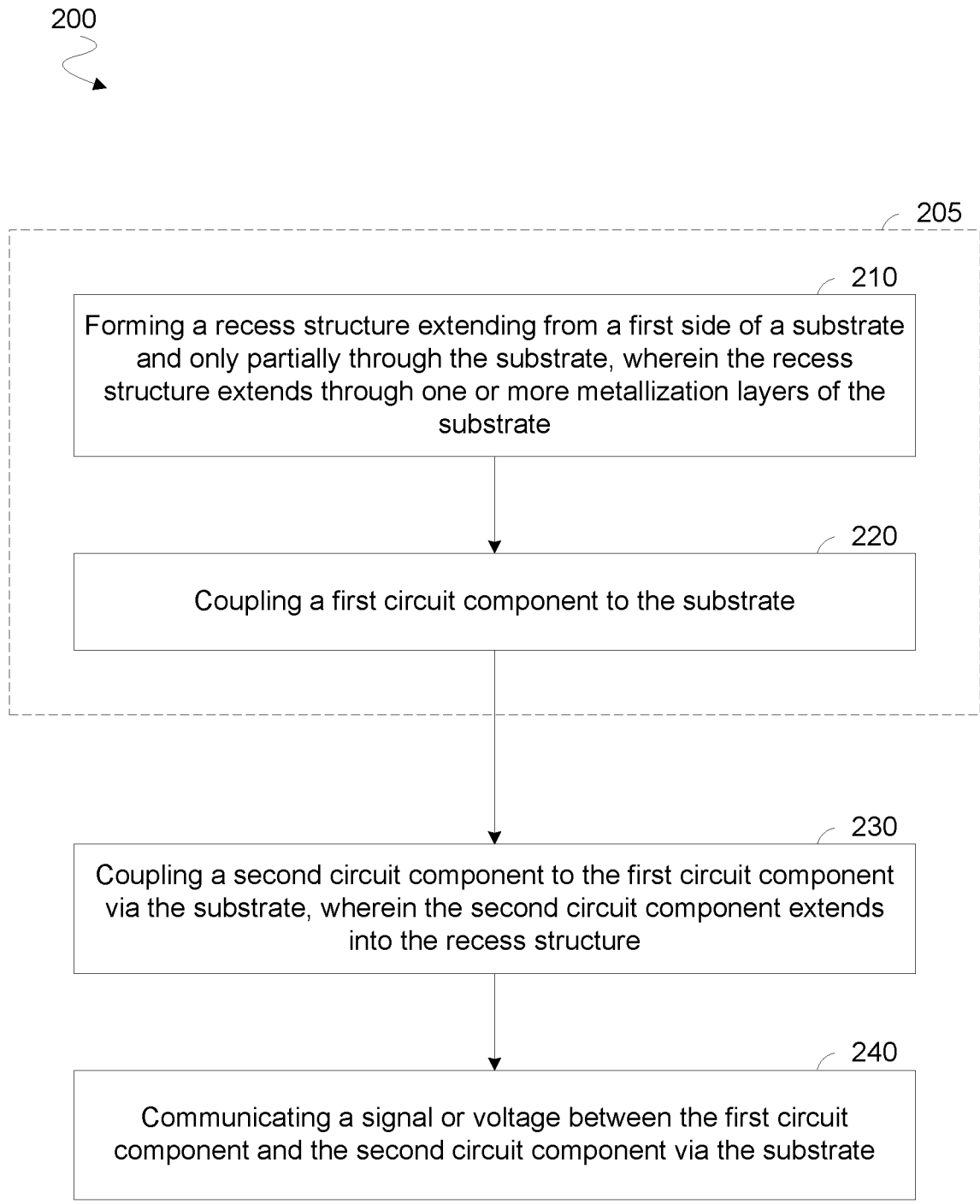
FIG. 2 is a flow diagram illustrating elements of a method for providing connectivity with interconnect structures of a substrate according to an embodiment.

FIG. 2 illustrates elements of a method 200 for providing connectivity of circuitry with a substrate according to an embodiment. Performance of method 200 may include manufacturing and/or operating a device having some or all of the features of system 100, for example. In some embodiments, method 200 includes producing assembly 110 or other such hardware having recess features disclosed herein. The particular order of the operations shown for method 200 may vary according to implementation-specific details, and is not limiting on some embodiments.

Method 200 may include fabrication, assembly and/or other manufacturing processes (e.g., including some or all of the illustrative operations 205 shown) to provide a microelectronics device forming a recess to receive one or more circuit components. For example, operations 205 may include, at 210, forming a recess structure extending from a first side of a substrate and partially through the substrate—e.g., toward a second side of the substrate opposite the first side. The forming at 210 may include one or more operations adapted from any of a variety of conventional drilling, cutting, etching and/or other subtractive techniques.

In an embodiment, the substrate includes one or more dielectric structures having interconnects variously formed therein. The dielectric structures may define exterior sidewalls forming a periphery of the substrate—e.g., wherein such dielectric structures are monolithic and/or the exterior sidewalls form a consistent cross-sectional profile along a thickness of the substrate. Such interconnects may form multiple layers of metallization which are stacked in parallel with each other—e.g., the layers of metallization variously comprising respective signal traces, ground planes and/or the like. Other interconnects of the substrate may include vias variously coupled between respective ones of such metallization layers. In one illustrative embodiment, the substrate includes an interposer to enable connection of integrated circuitry to one or more circuit components (e.g., including an active component and/or a passive component) that are to be included in, or may be coupled to, a final packaged microelectronic device.

The recess structure may be defined at least in part by interior sidewall structures of the substrate—e.g., where such sidewall structures include opposing sidewalls of the substrate that face one another. The sidewalls may define an opening that is 3 millimeters (mm) or more in width and/or in length, for example. However, such dimensions are merely illustrative, and may vary in different embodiments according to implementation-specific details.

The recess structure formed at 210 may extend through one or more—e.g., some but not all—metallization layers of the substrate. Formation of the recess structure may expose at least in part one or more interconnects. Some or all such exposed interconnect portions may each provide, or subsequently have formed thereon, a respective conductive contact (e.g., including a pad, solder ball or the like) to facilitate coupling of one or more circuit components. Formation of some or all such contacts—e.g., including the one or more contacts 124—may include additional mask, deposition, etch, solder and/or other operations (not shown) that, for example, are adapted in part from any of a variety of conventional techniques for forming conductive contacts of a microelectronic device. In one embodiment, such contacts are disposed on a floor of the recess structure. Alternatively or in addition, one or more of the contacts may be disposed on a sidewall of the recess structure. The disposing may include forming contacts of a ball grid array or other interface hardware.

Method 200 may further comprise, at 220, coupling a first circuit component to the substrate. The coupling at 220 may comprise wire bonding, flip chip attaching or otherwise coupling substrate 114 to an IC die (and/or any of various other active components or passive components) that is included in, or is to be included in, a package device comprising assembly 110. By way of illustration and not limitation, the first circuit component may be subsequently encapsulated by package material 112. Although some embodiments are not limited in this regard, operations 205, or other processes of method 200, may comprise packaging (not shown) of the first circuit component. Such packaging may include injection molding or otherwise disposing a package material around one or more IC dies and, in an embodiment, on the substrate. Although some embodiments are not limited in this regard, the substrate may be disposed within the package material after various circuit components are coupled to one another via the substrate—e.g., wherein one or more such circuit components are disposed in the recess formed at 210.

Although some embodiments are not limited in this regard, method 200 may additionally or alternatively include one or more operations whereby a recess structure such as that formed at 210 receives one or more circuit components—e.g., for coupling to assembly 110 or other such microelectronic device. For example, method 200 may include, at 230, coupling a second circuit component to the first component via the substrate, wherein the second circuit component extends into the recess structure. The second circuit component may be soldered or otherwise electrically coupled to one or more contacts that are disposed at a bottom portion (or other side) of the recess. The second circuit component may include a capacitor, an IC die and/or the like—e.g., wherein the second circuit component is itself a packaged microelectronic device. In an embodiment, a cross-sectional area of the recess structure formed at 210 is greater than a cross-sectional area of the second circuit component.

Although certain embodiments are not limited in this regard, method 200 may further comprise one or more additional operations (not shown) to facilitate coupling of a microelectronic device (which includes the substrate, the first circuit component and the second component) to a printed circuit board, a packaged microelectronic device or the like. For example, the microelectronic device may be packaged and have further formed thereon one or more solder balls (e.g., as a ball grid array) of another hardware interface—e.g., by processing adapted from conventional techniques for assembling integrated circuit systems. The solder balls (e.g., the one or more contacts 118) may enable coupling of the packaged microelectronic device to a printed circuit board or, alternatively, to another packaged device.

Method 200 may additionally or alternatively include operating a device that includes a recess structure such as that formed at 210. For example, method 200 may include, 240, communicating a signal or voltage between the first circuit component and the second circuit component via the substrate. Such operation may additionally or alternatively include performing signal communication or voltage communication between the second circuit component and a printed circuit board that is coupled to a packaged device including the substrate and the first circuit component.

Figure 3:
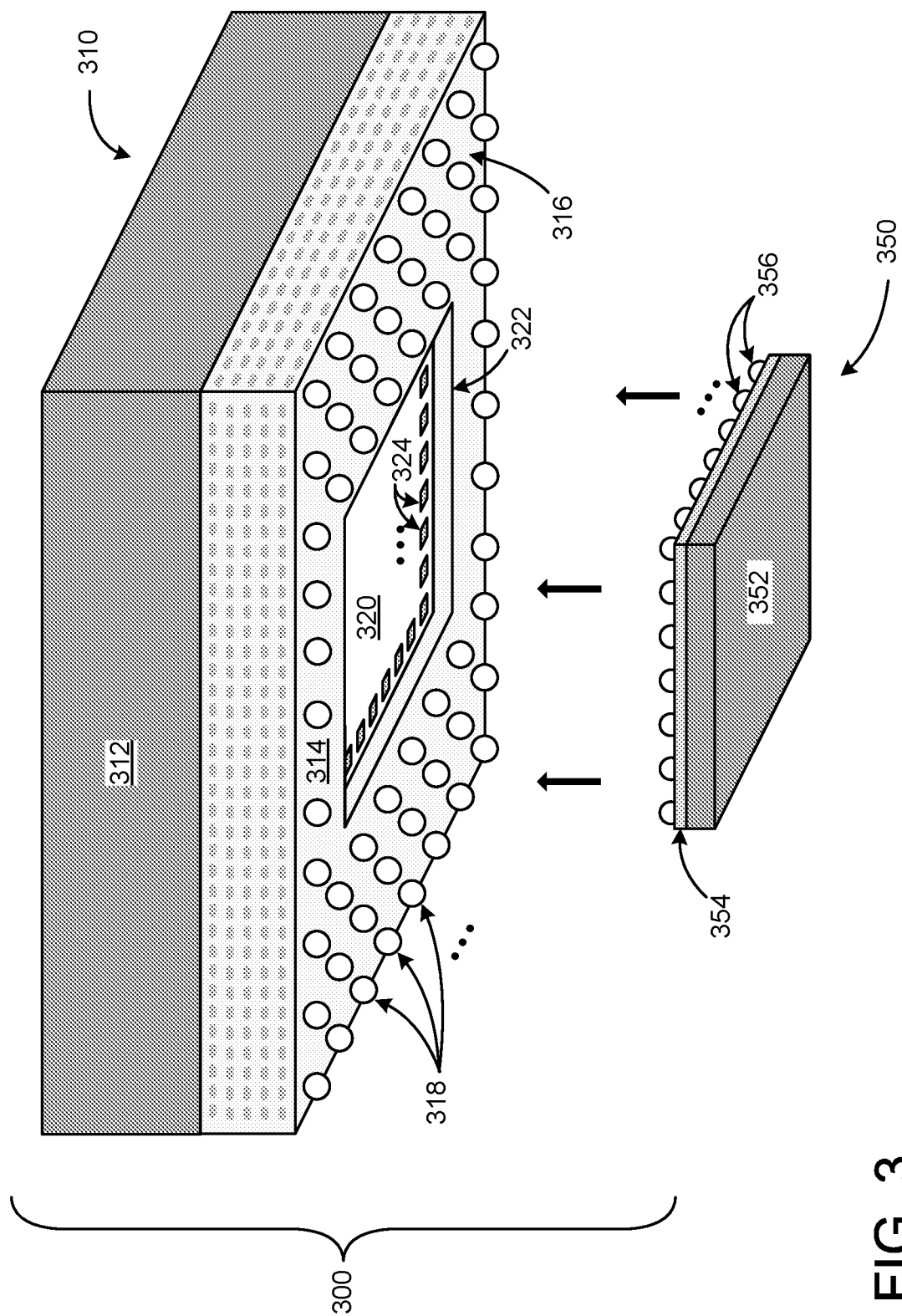
FIG. 3 is an exploded view of a system for providing interconnection of circuitry with a substrate according to an embodiment.

FIG. 3 is an exploded view of a system 300 to provide connectivity with a substrate according to an embodiment. System 300 may include some or all of the features of system 100, for example. System 300 includes a packaged device 310 and another packaged device 350 to couple to packaged device 310. Packaged devices 310, 350 may correspond functionally to assembly 110 and unit 150, respectively. Some embodiments are implemented entirely by a packaged device having, for example, some or all features of packaged device 310 or assembly 110. Production and/or operation of packaged device 310 may be according to method 200, in an embodiment.

In the illustrative embodiment shown, packaged device 310 includes a substrate 314 and a package material 312 having one or more IC dies (not shown) disposed therein. Substrate 314 and package material 312 may correspond functionally to substrate 114 and a package material 112, respectively. A side 316 of substrate 314 may have formed thereon one or more IO contacts 318 of a hardware interface that is to enable coupling of packaged device 310 to some other device (not shown) such as a PCB or a packaged device. The one or more contacts 318 may form at least part of a ball grid array, for example.

Packaged device 310 may further comprise another interface that is to enable coupling of packaged device 310 to packaged device 350. By way of illustration and not limitation, this other hardware interface may comprise one or more IO contacts 324 disposed in a recess structure 320 formed in packaged device 310. Side 316 may form an edge of a hole that extends through some, but not all, of a thickness of substrate 314 to form at least part of recess structure 320. In the illustrative embodiment shown, an edge 322 of side 316 defines at least in part a perimeter of a hole that extends from a plane of side 316 and partially toward an opposite side of substrate 314 (on which is disposed package material 312, for example).

As illustrated in FIG. 3, packaged device 350 may include a substrate 354—e.g., an interposer—and contacts 356 disposed thereon, where the contacts 356 are to couple to one or more contacts 324. Such coupling may facilitate operation of the one or more IC dies of packaged device 310 with circuit components (e.g., including one or more IC die, not shown) disposed in package material 352. In an illustrative embodiment, one of packaged devices 310, 350 includes one or more memory dies (e.g., NAND memory dies), where the other of packaged devices 310, 350 includes an ASIC or other IC die including memory controller circuitry to control operation of the one or more memory dies. However, any of a variety of additional or alternative types of dies may be variously distributed in packaged devices 310, 350, according to different embodiments.

Figure 4A:
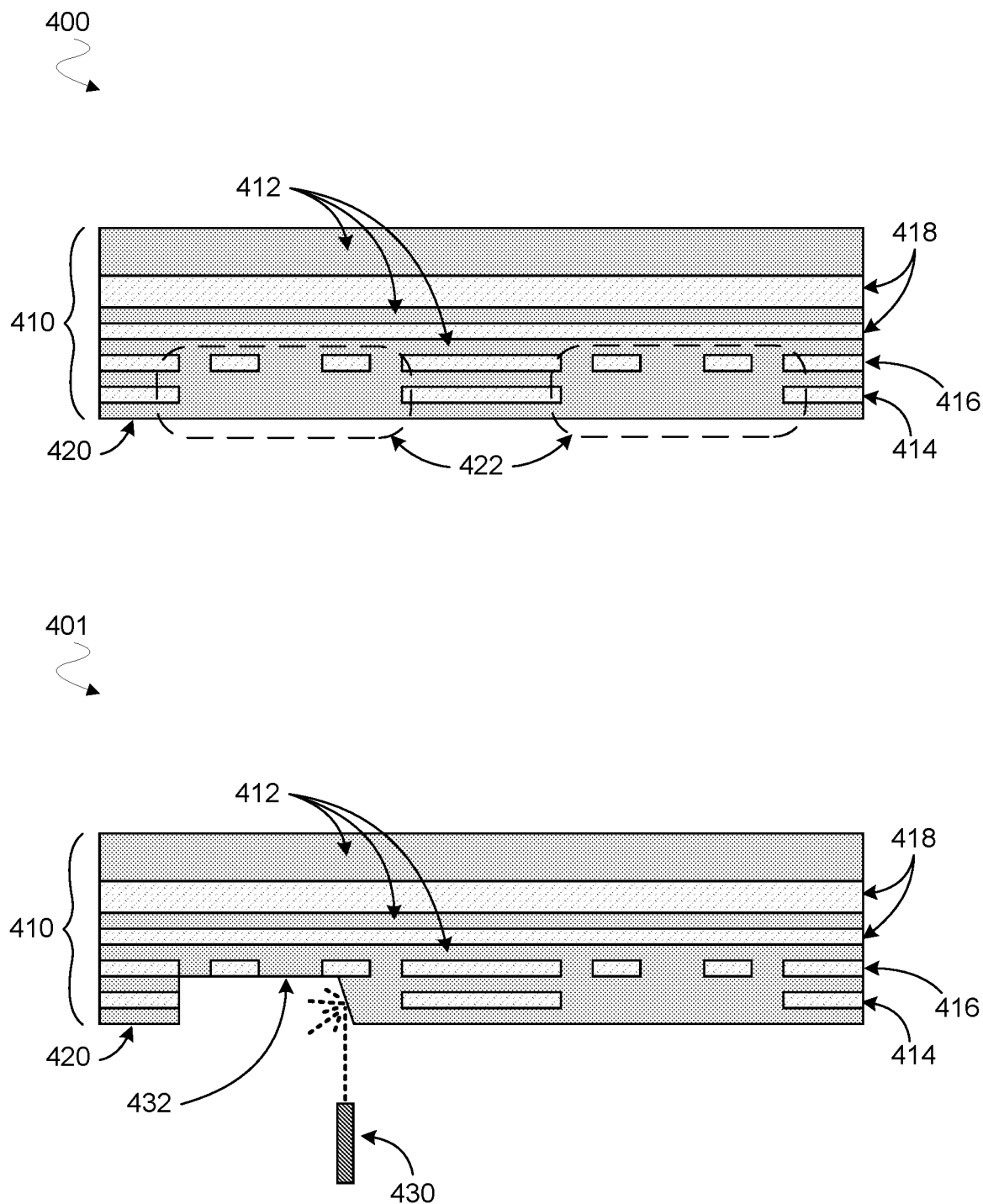
FIGS. 4A, 4B shows cross-sectional views illustrating operations to fabricate interconnect structures of a substrate according to an embodiment.
Figure 4B:
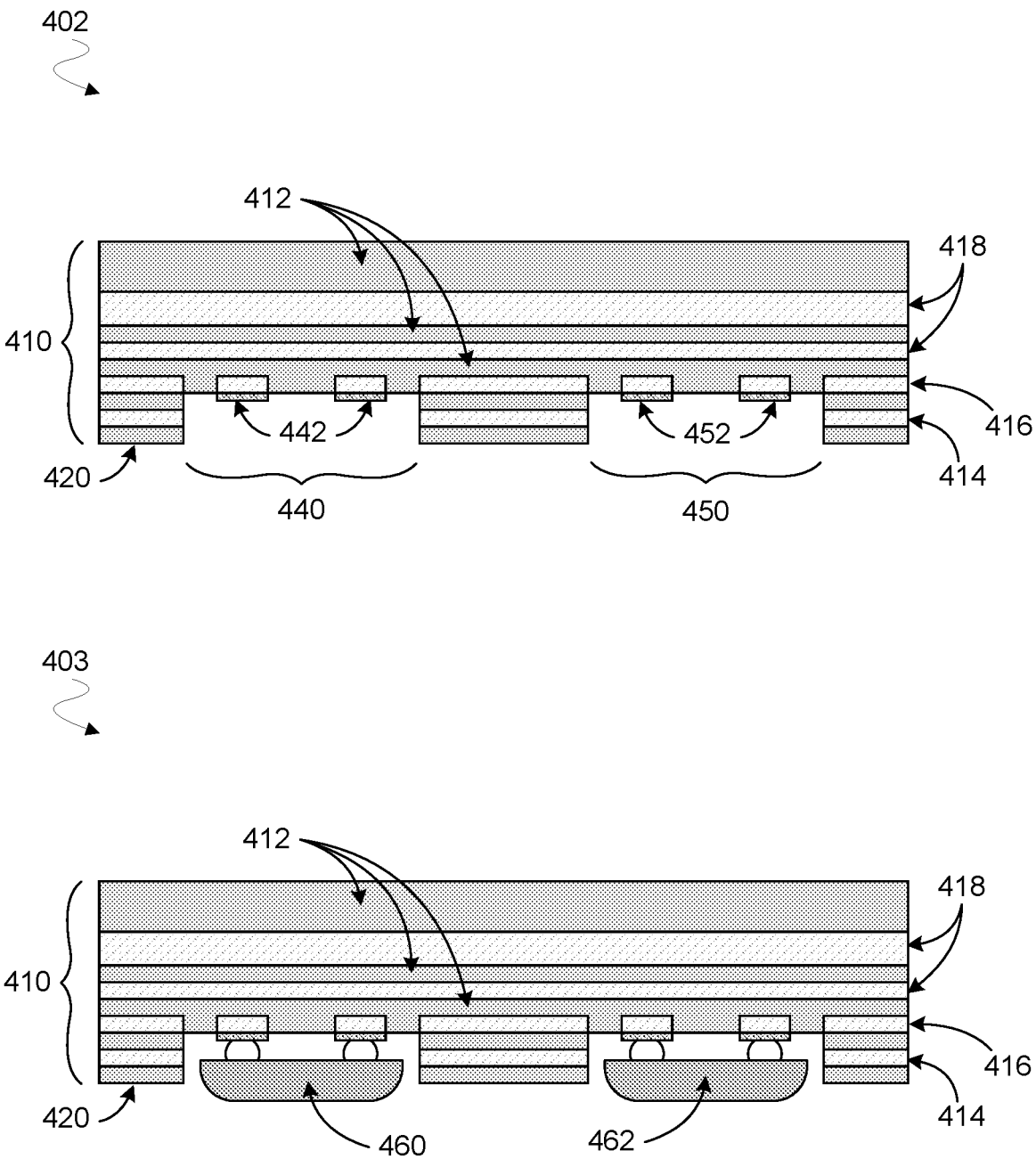

FIGS. 4A, 4B show, in cross-sectional views, various stages 400-403 of processing to provide connectivity of circuitry via a substrate according to an embodiment. Such processing may produce structures of a device such as assembly 110, device 310 or the like. In an embodiment, stages 400-403 include one or more of operations 205.

At stage 400, a substrate 410 may include a dielectric 412 and metal layers 414, 416, 418 variously extending in parallel with one another through respective levels of dielectric 412. Metal layers 414, 416, 418 may variously facilitate communication of respective signals and/or voltages through substrate 410. For one or more metallization layers—e.g., including one or more layers that are closest metal layers to a side 420 of substrate 410—the layers may include only conductive structures that are outside of one or more regions.

By way of illustration and not limitation, metal layer 414 may be closest to side 420, where any conductive structures of metal layer 414 resides outside of the example zones 422 shown. In such an embodiment, another metal layer—e.g., layer 416—may include conductive structures that are to be exposed by the formation of a recess that extends partially through substrate 410.

For example, as shown at stage 401, a laser 430 (or alternatively, a drill) may remove portions of dielectric 412 from substrate 410 to form one or more recesses. In the embodiment shown, ablation by laser 430 exposes a surface 432 in which or on which extends metal layer 416. After such processing with laser 430, substrate 410 may have formed therein the illustrative recesses 440, 450 each at a respective one of regions 422. However, the particular number and arrangement of the one or more recesses may vary, in different embodiments.

Conductive structures that are exposed by formation of recesses 440, 450 may have disposed thereon (or alternatively, may function as) contacts to facilitate coupling of one or more circuit components to substrate 410. By way of illustration and not limitation, plasma cleaning, patterned metal deposition, organic solderability protectant (OSP) finishing, nickel-palladium-gold (NiPdAu) finishing and/or other such processing may form on exposed portions of metal layer 416 contacts 442 disposed in recess 440 and contacts 452 disposed in recess 450 (as shown at stage 402). Contacts 442, 452 may enable soldering and/or other coupling of capacitors (or any of a variety of other passive circuit components and/or active circuit components) to substrate 410. For example, as shown at stage 403, recess 440 may receive some or all of a capacitor 460 for coupling of contacts 442 thereto—e.g., wherein recess 450 receives some or all of a capacitor 462 for coupling of contacts 452 thereto.

Figure 5:
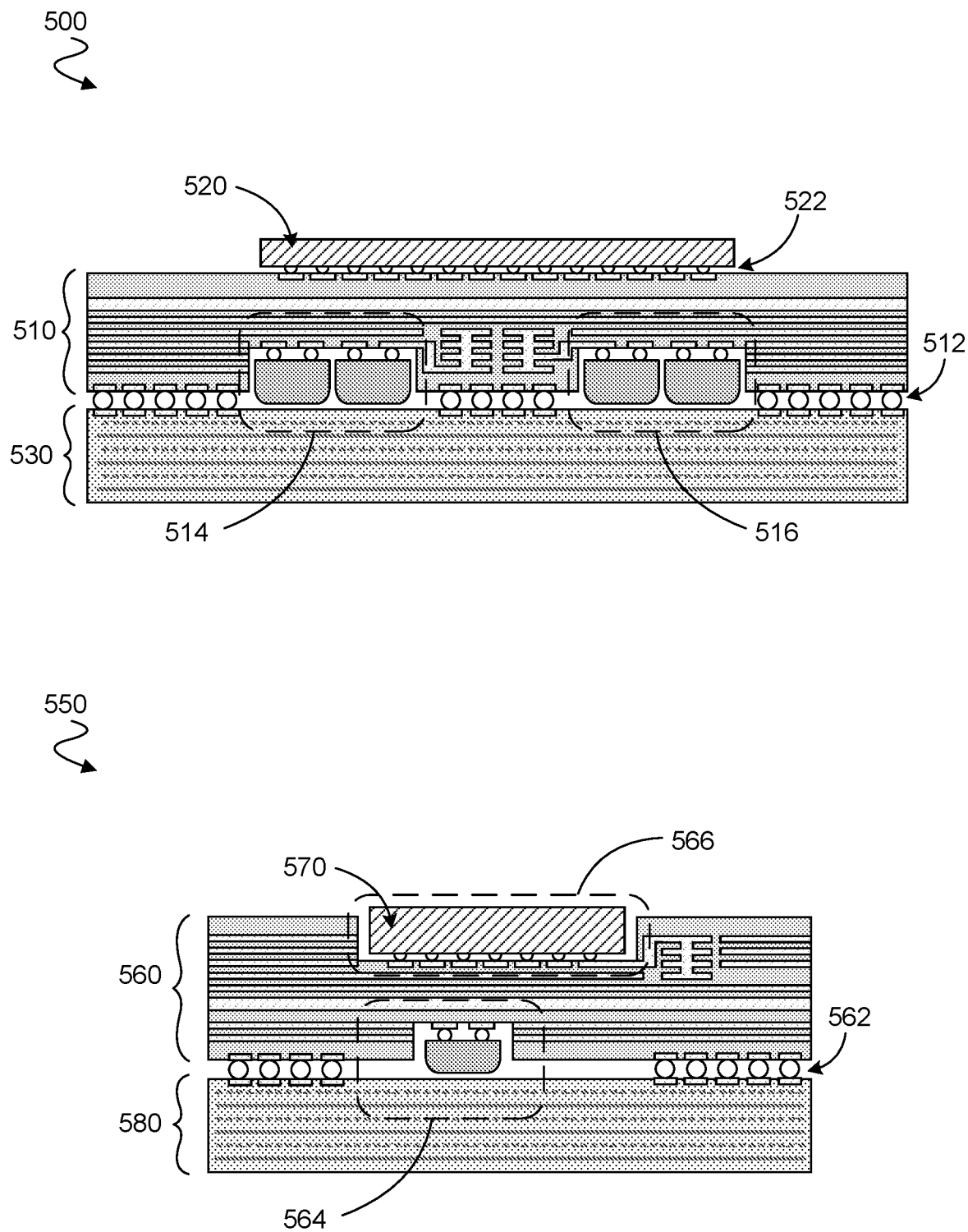
FIG. 5 shows cross-sectional views of systems providing respective interconnect structures each according to a corresponding embodiment.

FIG. 5 shows a cross-sectional side view of a system 500 to provide connectivity between circuit components according to an embodiment. System 500 may include one or more features of system 100 or system 300. Manufacture and/or operation of system 500 may be according to method 200, for example. In the illustrative embodiment shown, system 500 includes a substrate 510 having formed there in one or more recesses (such as the illustrative recesses 514, 516 shown). Such one or more recesses may facilitate improved z-height dimensions of interconnected circuit components. By way of illustration and not limitation, one or both of recesses 514, 516 may have disposed there in respective one or more circuit components—e.g., including a capacitors and/or other such circuit elements—that variously extend past one or more metallization layers of substrate 510 and couple to another one or more such metallization layers. In accommodating such circuit components at least in part, recesses 514, 516 may allow for a relatively lower vertical profile of substrate 510—e.g., as measured from a printed circuit board 530 coupled to substrate substrate 510 via a hardware interface 512. Although some embodiments are not limited in this regard, substrate 510 may be coupled to one or more other circuit components that are not recessed. For example, an IC die 520 may be coupled to a top side of substrate 510 via another hardware interface 522.

FIG. 5 also shows a cross-sectional side view of a system 550 to provide connectivity between circuit components according to another embodiment. System 550 may include features of system 100 or system 300—e.g., where in functionality of the system 550 is provided according to method 200. In the illustrative embodiment shown, system 550 includes a substrate 560 coupled via a hardware interface 562 to a printed circuit board 580. System 550 is one example of an embodiment wherein circuit components are variously disposed each in a respective recess formed by substrate 560, where at least some such recesses are formed in different respective sides of substrate 560. By way of illustration and not limitation, a recess 564 may extend from a bottom side of substrate 560 that is closest to printed circuit board 580. By contrast, another recess 566 may extend from a top side of substrate 560, wherein recess 566 is to receive at least part of a circuit component 570—e.g., including an IC die—for coupling to a metallization layer within substrate 560.

Figure 6:
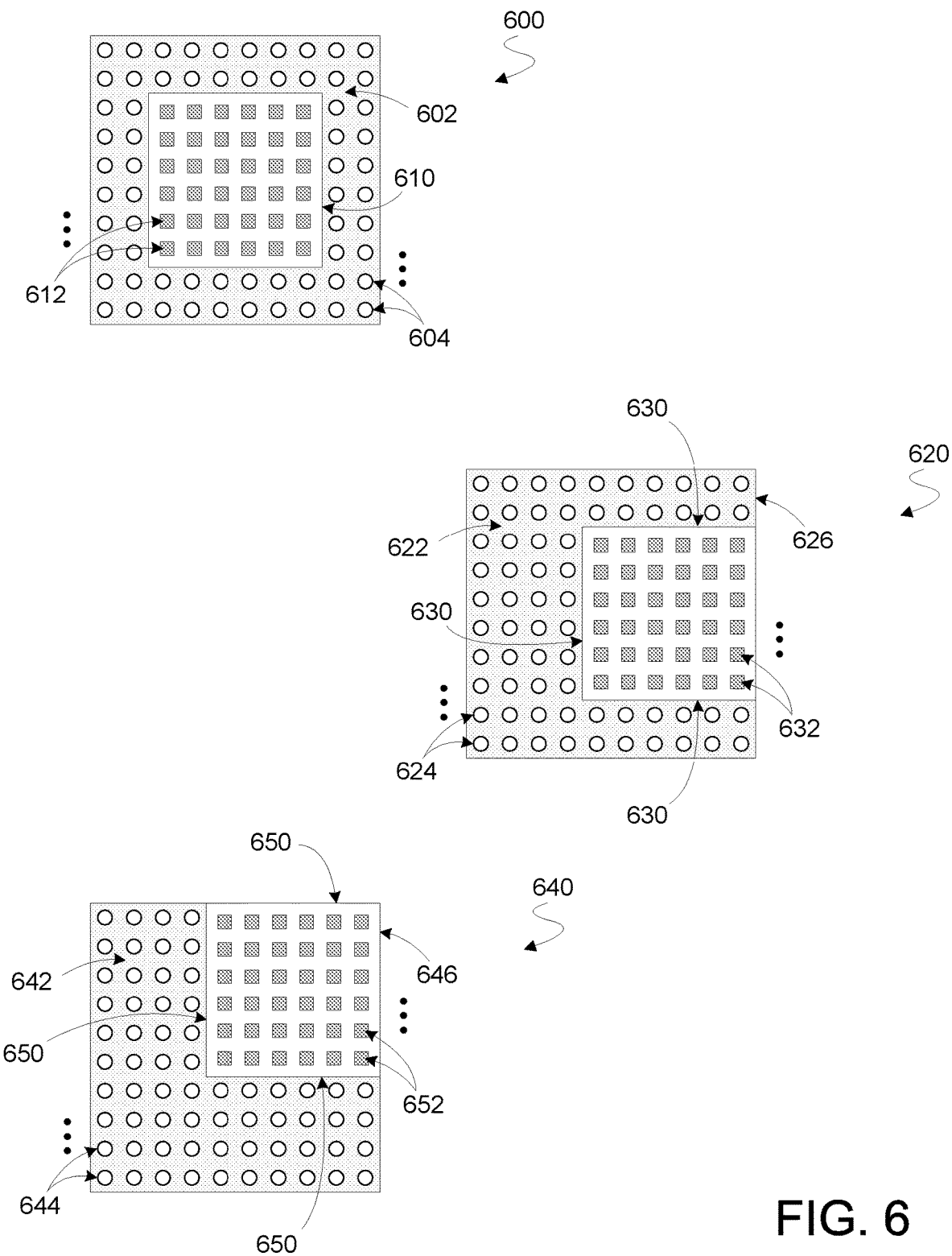
FIG. 6 shows plan views of respective substrates each including interconnect structures according to a corresponding embodiment.

FIG. 6 illustrates respective elements of various substrates 600, 620, 640 each according to a corresponding embodiment. Some or all of substrates 600, 620, 640 may variously comprise features of one of substrates 114, 314, 410, 510, 560 or the like. In an embodiment, method 200 includes operations to form a recess structure of one of substrates 600, 620, 640.

Substrate 600 may have disposed thereon structures to enable coupling of a metallization layer in device 600 to a passive circuit element, a packaged device and/or other such circuit components. For example, a side 602 of substrate 600 may accommodate one or more contacts 604 of a first hardware interface. In an embodiment, an interior edge 610 of side 602 defines at least in part a recess structure that extends only partially through substrate 600. A floor of the recess structure may have formed thereon one or more contacts 612 of another hardware interface that is to facilitate coupling of one or more other circuit components each with a respective metallization layer of substrate 600.

Substrate 620 represents another embodiment wherein one or more contacts 624 of a first hardware interface are disposed on a side 622. Edges 630 of side 622 may define a recess structure that has formed therein one or more contacts 632 (e.g., including one or more contacts 124) of another hardware interface. In the embodiment of substrate 600, side 602 surrounds a perimeter of the recess structure that has one or more contacts 612 disposed therein. By contrast, the recess structure defined at least in part by edges 630 extends to an edge 626—e.g., where side 622 extends only partially around the recess structure of substrate 620. For example, the recess structure may be defined in part by edges 630 that form a notch at edge 626.

Substrate 640 represents another embodiment wherein one or more contacts 644 of a first hardware interface are disposed on a side 642. Edges 650, 646 of side 642 may define a recess structure that has formed therein one or more contacts 652 (e.g., including one or more contacts 124) of another hardware interface. The recess structure defined at least in part by edges 650 may extend to a corner of substrate 640.

Figure 7:
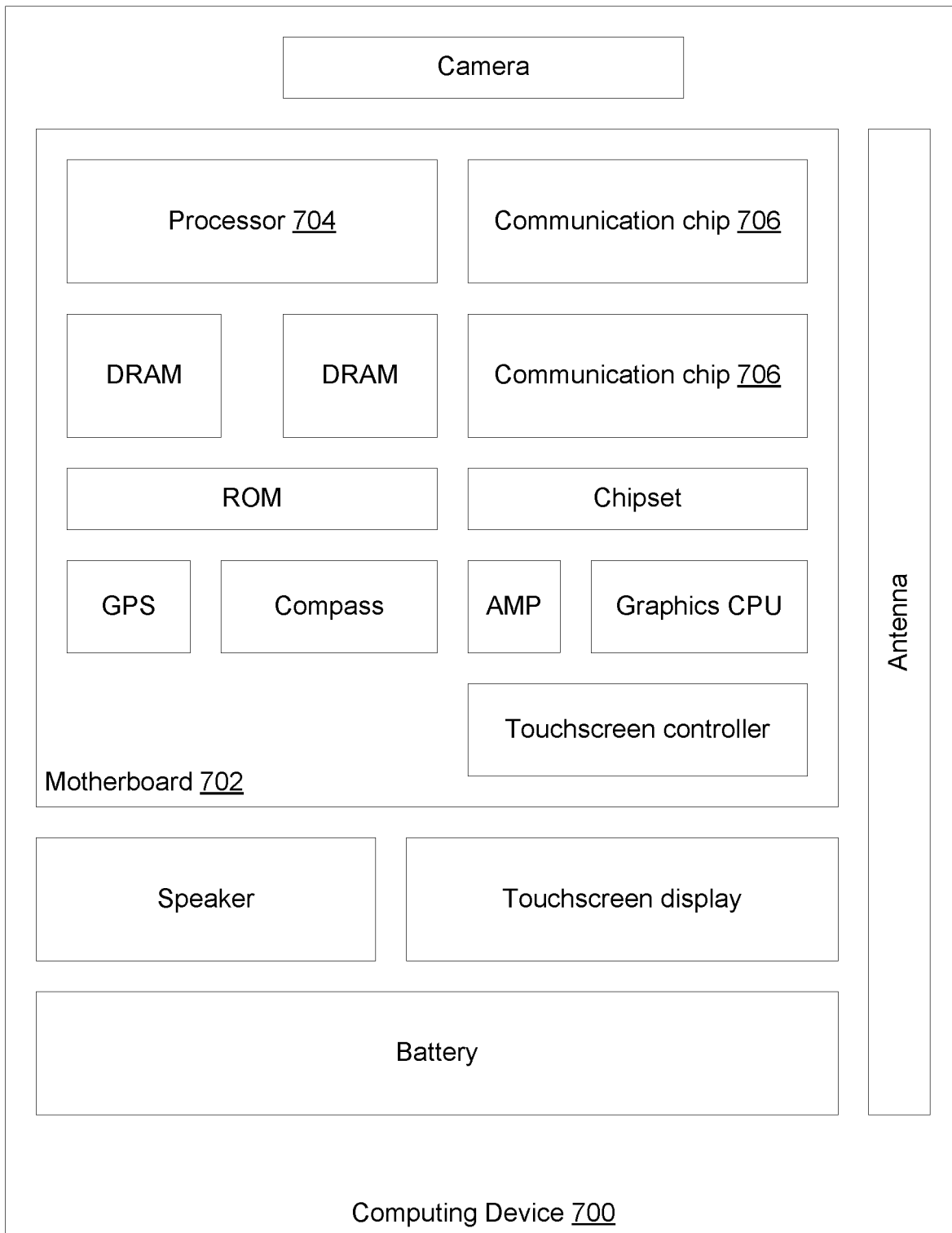
FIG. 7 is a functional block diagram illustrating elements of a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
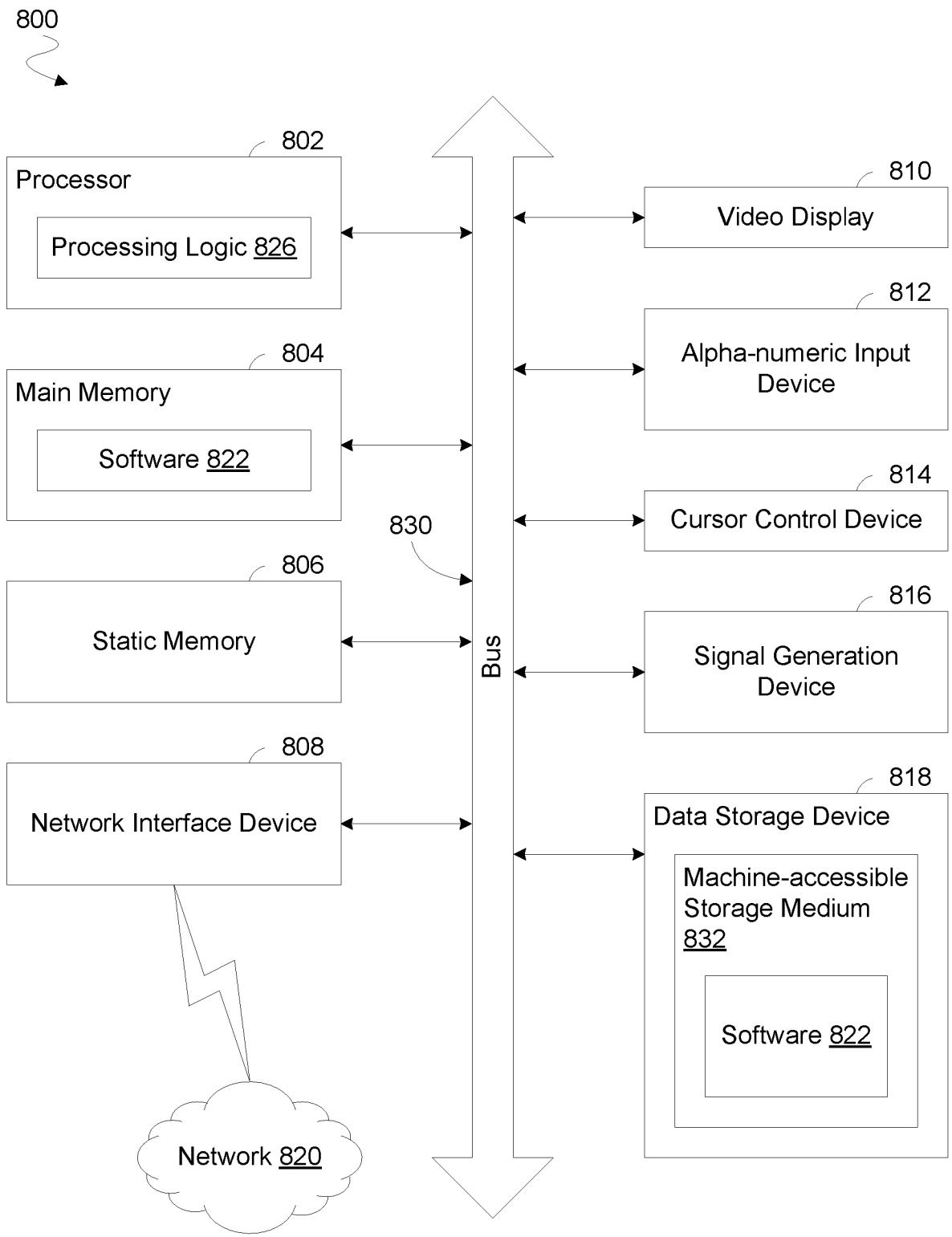
FIG. 8 is a functional block diagram illustrating elements of an exemplary computer system, in accordance with an embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a microelectronic device comprises one or more integrated circuit (IC) die, a substrate coupled to the one or more IC die, wherein sidewalls of the substrate define at least in part a first recess structure which extends from a first side of the substrate and only partially toward a second side of the substrate opposite the first side, wherein first input/output (IO) contacts of a first hardware interface are disposed at a bottom portion of the first recess structure, the first IO contacts coupled to the one or more IC die via a first metallization layer of the substrate, wherein the first recess structure extends through one or more other metallization layers of the substrate, and a second hardware interface comprising second IO contacts disposed on the substrate, the second IO contacts to couple the microelectronic device to another device.

In one embodiment, other sidewalls of the substrate define at least in part a second recess structure which extends from the second side of the substrate and only partially toward the first side of the substrate. In another embodiment, the second hardware interface is disposed on the first side. In another embodiment, the substrate includes an interposer. In another embodiment, the microelectronic device further comprises a first circuit component coupled to the substrate via the first hardware interface, wherein the first circuit component is disposed at least in part in the first recess structure. In another embodiment, the first circuit component includes a capacitor. In another embodiment, the first circuit component includes another IC die. In another embodiment, the first circuit component includes a packaged device. In another embodiment, microelectronic device further comprises a package material disposed on the one or more IC die. In another embodiment, the sidewalls comprise a first sidewall which extends to a first exterior side of the substrate. In another embodiment, the sidewalls further comprise a second sidewall which extends to a second exterior side of the substrate. In another embodiment, the microelectronic device further comprises a printed circuit board coupled to the substrate via the second hardware interface.

In another implementation, a method comprises forming in a substrate a first recess structure which extends from a first side of the substrate and only partially through the substrate, wherein the first recess structure extends through one or more metallization layers of the substrate, forming first input/output (IO) contacts of a first hardware interface at a bottom portion of the first recess structure, the first IO contacts coupled to a first metallization layer of the substrate, coupling one or more integrated circuit (IC) die to the substrate, wherein the first IO contacts are coupled to the one or more IC die via the first metallization layer, and disposing on the substrate a second hardware interface comprising second IO contacts.

In one embodiment, the method further comprises coupling a second circuit component to the first circuit component via the substrate, wherein the second circuit component extends into the first recess structure. In another embodiment, the method further comprises forming in the substrate a second recess structure which extends from a second side of the substrate, opposite the first side, and only partially toward the first side. In another embodiment, the second hardware interface is disposed on the first side. In another embodiment, forming the first recess structure includes laser etching a portion of the substrate. In another embodiment, forming the first recess structure includes drilling a portion of the substrate. In another embodiment, the substrate includes an interposer. In another embodiment, the sidewalls comprise a first sidewall which extends to a first exterior side of the substrate. In another embodiment, the sidewalls further comprise a second sidewall which extends to a second exterior side of the substrate.

In another implementation, a system comprises a printed circuit board (PCB) and a microelectronic device coupled to the PCB. The microelectronic device includes one or more integrated circuit (IC) die, a substrate coupled to the one or more IC die, wherein sidewalls of the substrate define at least in part a first recess structure which extends from a first side of the substrate and only partially toward a second side of the substrate opposite the first side, wherein first input/output (IO) contacts of a first hardware interface are disposed at a bottom portion of the first recess structure, the first IO contacts coupled to the one or more IC die via a first metallization layer of the substrate, wherein the first recess structure extends through one or more other metallization layers of the substrate, and a second hardware interface comprising second IO contacts disposed on the substrate, wherein the PCB is coupled to the microelectronic device via the second IO contacts. The system further comprises a first circuit component coupled to the microelectronic device via the first hardware interface, wherein the first circuit component is disposed at least in part in the first recess structure.

In one embodiment, other sidewalls of the substrate define at least in part a second recess structure which extends from the second side of the substrate and only partially toward the first side of the substrate. In another embodiment, the second hardware interface is disposed on the first side. In another embodiment, the substrate includes an interposer. In another embodiment, the first circuit component includes a capacitor. In another embodiment, the first circuit component includes another IC die. In another embodiment, the first circuit component includes a packaged device. In another embodiment, the system further comprises a package material disposed on the one or more IC die. In another embodiment, the sidewalls comprise a first sidewall which extends to a first exterior side of the substrate. In another embodiment, the sidewalls further comprise a second sidewall which extends to a second exterior side of the substrate.

Techniques and architectures for coupling a circuit component to a substrate are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A microelectronic device comprising:
   one or more integrated circuit (IC) die;
   a substrate coupled to the one or more IC die, wherein sidewalls of the substrate define at least in part a first recess structure which extends from a first side of the substrate and only partially toward a second side of the substrate opposite the first side, wherein first input/output (IO) contacts of a first hardware interface are disposed at a bottom portion of the first recess structure, the first IO contacts coupled to the one or more IC die, wherein the first recess structure extends through one or more metallization layers of the substrate, wherein other sidewalls of the substrate define at least in part a second recess structure which extends from the second side of the substrate and only partially toward the first side of the substrate, wherein the first recess structure has a first lateral width and a first footprint, the second recess structure has a second lateral width and a second footprint, and wherein the first lateral width is greater than the second lateral width, and the second footprint is entirely within the first footprint;
   a first circuit component coupled to the substrate, wherein the first circuit component is disposed at least in part in the second recess structure; and
   a second hardware interface comprising second IO contacts disposed on the substrate, the second IO contacts to couple the microelectronic device to another device.

2. The microelectronic device of claim 1, wherein the second hardware interface is disposed on the first side.

3. The microelectronic device of claim 1, wherein the substrate includes an interposer.

4. The microelectronic device of claim 1, wherein the first circuit component includes a capacitor.

5. The microelectronic device of claim 1, wherein the first circuit component includes another IC die.

6. The microelectronic device of claim 1, wherein the first circuit component includes a packaged device.

7. The microelectronic device of claim 1, further comprising a package material disposed on the one or more IC die.

8. The microelectronic device of claim 1, wherein the sidewalls comprise a first sidewall which extends to a first exterior side of the substrate.

9. The microelectronic device of claim 8, wherein the sidewalls further comprise a second sidewall which extends to a second exterior side of the substrate.

10. The microelectronic device of claim 1, further comprising a printed circuit board coupled to the substrate via the second hardware interface.

11. A method comprising:
    forming in a substrate a first recess structure which extends from a first side of the substrate and only partially through the substrate, wherein the first recess structure extends through one or more metallization layers of the substrate, and wherein the first recess structure has a first lateral width and a first footprint;

forming in the substrate a second recess structure which extends from a second side of the substrate and only partially through the substrate, the second side opposite the first side, wherein the second recess structure extends through one or more metallization layers of the substrate, wherein second recess structure has a second lateral width and a second footprint, and wherein the first lateral width is greater than the second lateral width, and the second footprint is entirely within the first footprint;

forming first input/output (IO) contacts of a first hardware interface at a bottom portion of the first recess structure;

coupling one or more integrated circuit (IC) die to the substrate, wherein the first IO contacts are coupled to the one or more IC die;

coupling a first circuit component coupled to the substrate, wherein the first circuit component is disposed at least in part in the second recess structure; and disposing on the substrate a second hardware interface comprising second IO contacts.

12. The method of claim 11, wherein the second hardware interface is disposed on the first side.

13. The method of claim 11, wherein forming the first recess structure includes laser etching a portion of the substrate.

14. The method of claim 11, wherein forming the first recess structure includes drilling a portion of the substrate.

15. The method of claim 11, wherein the substrate includes an interposer.

16. The method of claim 11, wherein the first recess structure comprises a sidewall which extends to an exterior side of the substrate.

17. A system comprising:
a printed circuit board (PCB);
a microelectronic device coupled to the PCB, the microelectronic device including:
  one or more integrated circuit (IC) die;
  a substrate coupled to the one or more IC die, wherein sidewalls of the substrate define at least in part a first recess structure which extends from a first side of the substrate and only partially toward a second side of the substrate opposite the first side, wherein first input/output (IO) contacts of a first hardware interface are disposed at a bottom portion of the first recess structure, the first IO contacts coupled to the one or more IC die, wherein the first recess structure extends through one or more metallization layers of the substrate, wherein other sidewalls of the substrate define at least in part a second recess structure which extends from the second side of the substrate and only partially toward the first side of the substrate, wherein the first recess structure has a first lateral width and a first footprint, the second recess structure has a second lateral width and a second footprint, and wherein the first lateral width is greater than the second lateral width, and the second footprint is entirely within the first footprint;
a first circuit component coupled to the substrate, wherein the first circuit component is disposed at least in part in the second recess structure; and
a second hardware interface comprising second IO contacts disposed on the substrate, wherein the PCB is coupled to the microelectronic device via the second IO contacts.

18. The system of claim 17, wherein the second hardware interface is disposed on the first side.

19. The system of claim 17, wherein the substrate includes an interposer.

* * * * *